US007225375B2

(12) United States Patent
Cochran et al.

(10) Patent No.: US 7,225,375 B2
(45) Date of Patent: May 29, 2007

(54) METHOD AND APPARATUS FOR DETECTING ARRAY DEGRADATION AND LOGIC DEGRADATION

(75) Inventors: William Hugh Cochran, Rochester, MN (US); William Paul Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 10/815,248

(22) Filed: Mar. 31, 2004

(65) Prior Publication Data

US 2005/0229060 A1    Oct. 13, 2005

(51) Int. Cl.
*G01R 31/28* (2006.01)

(52) U.S. Cl. .................................... 714/733

(58) Field of Classification Search ............... 714/733, 714/718, 719, 720, 710, 711
See application file for complete search history.

(56) References Cited

U.S. PATENT DOCUMENTS

| 5,652,729 | A | 7/1997 | Iwata et al. |
| 6,295,237 | B1 * | 9/2001 | Pochmuller ................. 365/201 |
| 6,483,764 | B2 | 11/2002 | Hsu et al. |
| 6,640,321 | B1 * | 10/2003 | Huang et al. ............... 714/720 |

* cited by examiner

*Primary Examiner*—James C Kerveros
(74) *Attorney, Agent, or Firm*—Joan Pennington

(57) ABSTRACT

A method and apparatus are provided for detecting degradation, such as, array degradation and logic degradation, in integrated circuits (ICs) including application specific integrated circuits (ASICs). A monitor built-in self-test (MBIST) engine coupled to at least one monitor element that is defined by predefined circuit elements in the integrated circuit. The MBIST engine is used for controlling operation of at least one monitor element for communicating with monitor bits to identify degradation of signal, timing and voltage margins.

16 Claims, 2 Drawing Sheets

METHOD AND APPARATUS FOR DETECTING ARRAY DEGRADATION AND LOGIC DEGRADATION

FIELD OF THE INVENTION

The present invention relates generally to the field of integrated circuit design, and more particularly, relates to a method and apparatus for detecting degradation, such as, array degradation and logic degradation, in integrated circuits including application specific integrated circuits (ASICs).

DESCRIPTION OF THE RELATED ART

An effective mechanism is needed for detecting circuit degradation, such as, array degradation and logic degradation, in integrated circuits. Circuit devices degrade over time. Some devices are marginal and can fail early in the life of the part. Every circuit on a chip is subject to wearout mechanisms, such as, negative bias temperature instability (NBTI) and hot electrons, which cause changes to occur in individual transistors. These changes are a function of how the transistor is used as a function of time, for example, when a circuit is gated, as in clock tree gating, the circuit undergoes different aging than a circuit that is not gated.

Dynamic random access memories (DRAMs) require that the contents of the storage cells be refreshed or rewritten periodically, often referred to as the Refresh Rate, to maintain the integrity of the memory. The Refresh Rate is determined by the amount of leakage in the storage cell. This leakage is determined in part by process and device design, the junction temperature range for the expected operation of the device, and the like.

Leakage is a difficult parameter to accurately specify, so to guarantee data retention, a large amount of guard band is added to device testing and typically the Refresh Rate is two times or more of what is believed to be the worst case.

As memory devices become denser, operate at higher and higher bandwidth, and memory is packed into tighter and tighter packages, the junction temperature is beginning to exceed current industry limits. The current approach to increasing the maximum junction temperature is to refresh twice as often. This does not guarantee zero errors and it impacts system performance.

Other items that affect the ability of device to correctly read or write its contents include timing margin, surrounding cell patterns, transistor degradation due to stress, for example, in cell or timing/control circuits associated with the array, marginal defects, power supply noise, such as, AC changes at a critical time for either the cell or timing/control circuitry, power supply DC above or below normal operating range, and the like. These issues affect both DRAM arrays and any other types of memory array structures, such as ROM, EPROM, EEPROM, NVRAM, SRAM, and FLASH.

SUMMARY OF THE INVENTION

Principal aspects of the present invention are to provide a method and apparatus for detecting degradation, such as, array degradation and logic degradation, in integrated circuits (ICs) including application specific integrated circuits (ASICs). Other important aspects of the present invention are to provide such method and apparatus for detecting degradation substantially without negative effect and that overcome many of the disadvantages of prior art arrangements.

In brief, a method and apparatus are provided for detecting degradation, such as, array degradation and logic degradation, in integrated circuits (ICs) including application specific integrated circuits (ASICs). A monitor built-in self-test (MBIST) engine is provided. At least one monitor element is coupled to the MBIST engine and is defined by predefined circuit elements in the integrated circuit. The MBIST engine is used for controlling operation of at least one monitor element for communicating with monitor bits to identify degradation of signal, timing and voltage margins.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
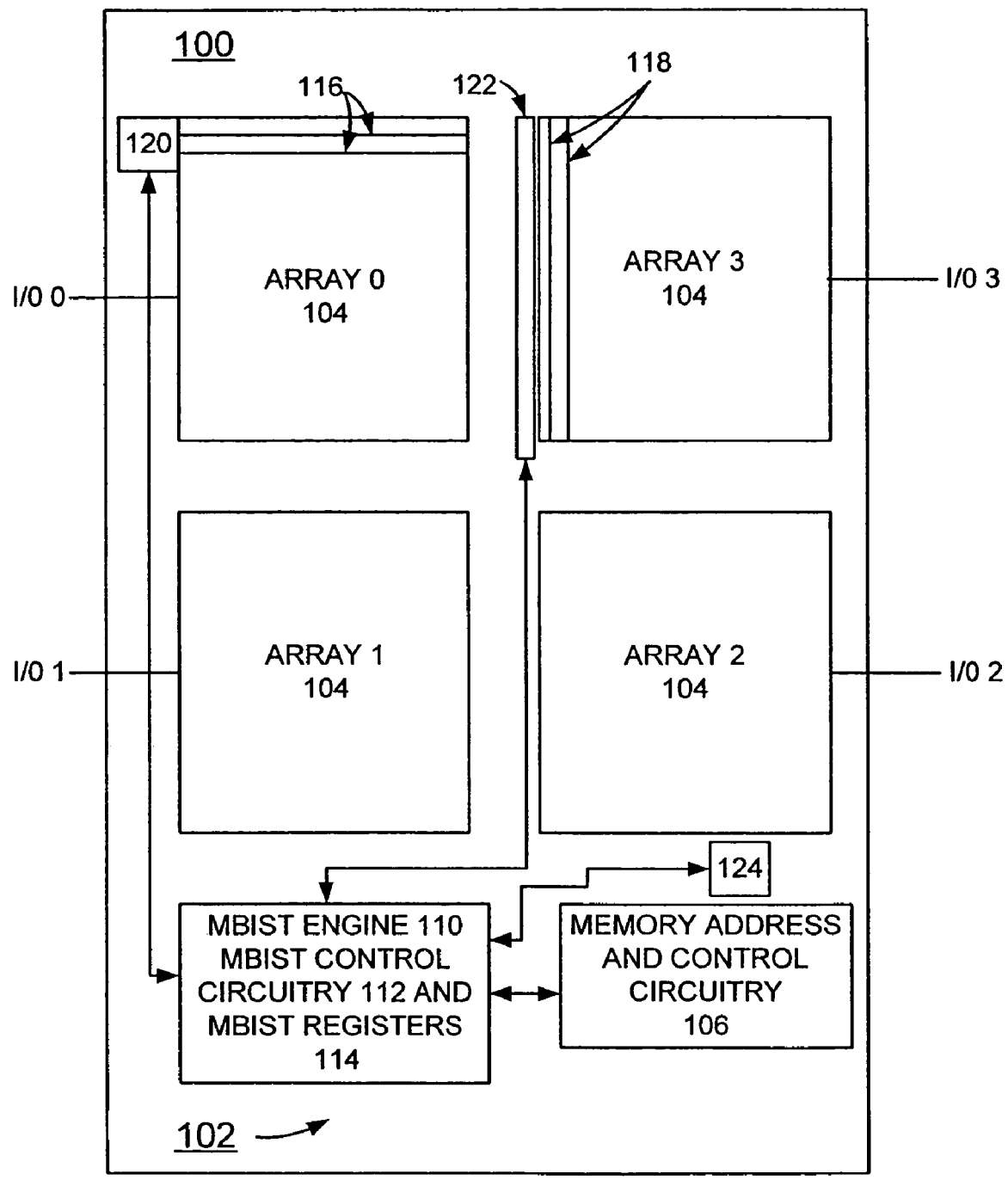
FIG. 1 is a block diagram illustrating an exemplary memory device having degradation detection apparatus in accordance with the preferred embodiment.

Having reference now to the drawings, in FIG. 1, there is shown an exemplary memory device 100 with exemplary degradation detection apparatus generally designated by the reference character 102 for implementing degradation detection in accordance with the preferred embodiment. Memory device 100 includes a plurality of arrays 104, 0–3, each having a respective associated input/output (I/O). Memory device 100 includes a memory address and control circuitry 106.

Figure 2:
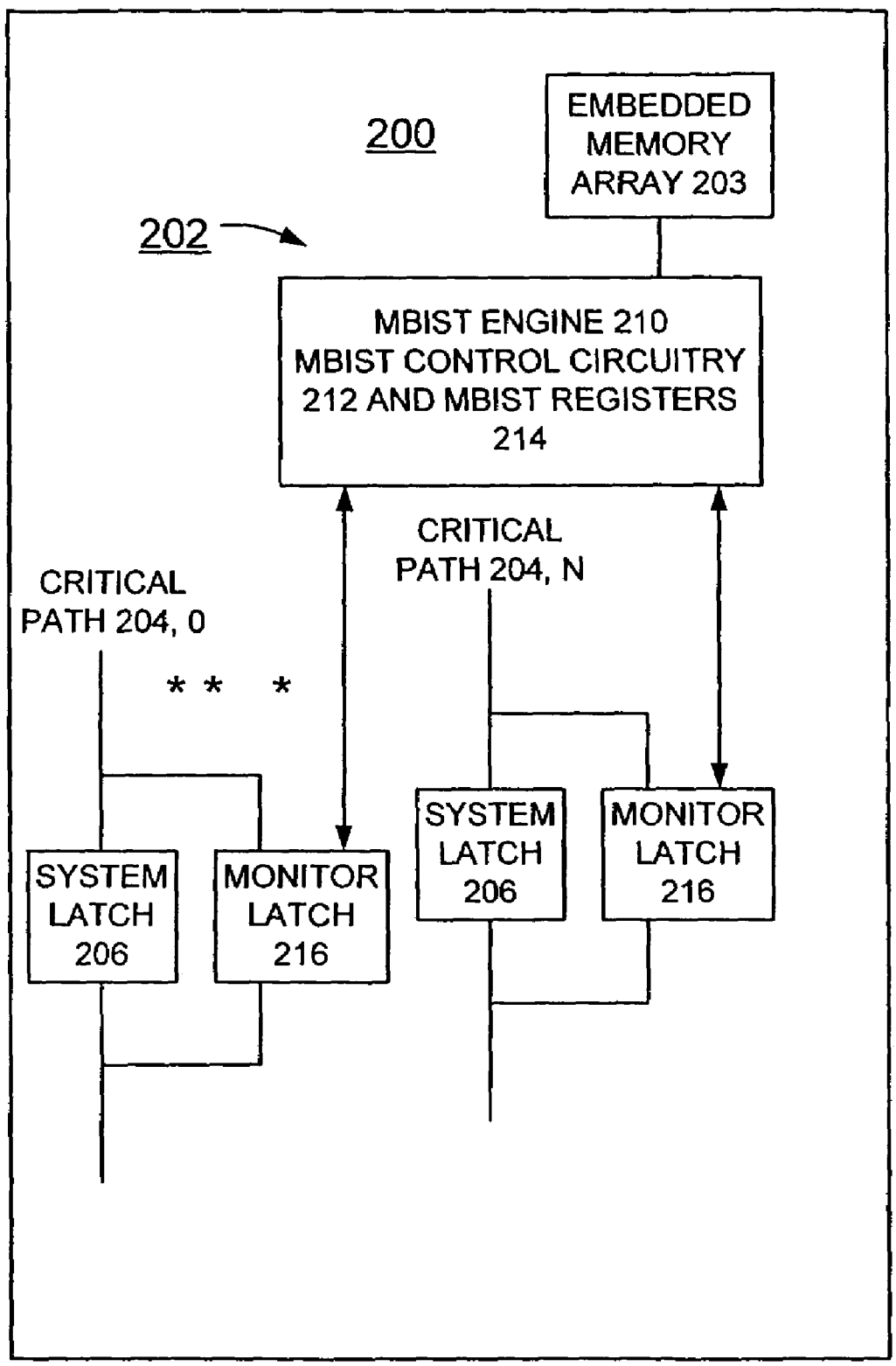
FIG. 2 is a block diagram illustrating an exemplary application specific integrated circuit (ASIC) having degradation detection apparatus in accordance with the preferred embodiment.

In accordance with features of the preferred embodiment, the degradation detection apparatus 102 advantageously is applied to a memory device 100 as shown in FIG. 1 and also advantageously is applied to a logic portion of both processor chips and various ASICs, for example, as shown in FIG. 2, to sense chip performance degradation over time due to wearout mechanisms, such as, EM or hot-carrier (hot-e) effects.

Degradation detection apparatus 102 includes a monitor built-in self-test (MBIST) engine 110 including MBIST control circuitry 112 and MBIST registers 114 coupled to the memory address and control circuitry 106 and to multiple monitored devices. As shown in FIG. 1, degradation detection apparatus 102 includes a plurality of monitor bit lines 116, such as redundant bit lines 116 within the memory array 104, 0, and a plurality of monitor word lines 118, such as redundant word lines 118 within the memory array 104, 3. As shown in FIG. 1, degradation detection apparatus 102 includes a pair of latch circuits 120, 122 for monitor bits used to communicate to and from the MBIST engine 110, respectively coupled between the monitor bit lines 116 and the monitor word lines 118 and the MBIST engine 110. As shown in FIG. 1, degradation detection apparatus 102 includes a separate monitor array 124. The separate monitor array 124 includes unique word lines, bit lines, and control and sense circuitry.

In accordance with features of the preferred embodiment, monitor elements, such as monitor bit lines 116, and monitor word lines 118, are real array elements used with the same circuits as memory arrays 104 0, 3 or monitor elements, such as the separate monitor array 124 are instantiations of the same circuits as the real arrays. As a result no translation is necessary. Operation can be deterministically stressed, for example, for refresh in the case of a DRAM, or for timing/voltage/temperature margin in the case of any array type. This allows the monitor elements to be operated exactly like the real elements and typically at the same time as the real elements thereby enhancing detection of failures caused by second and third order events that may contribute to margin degradation, such as, power supply or signal coupling noise, simultaneous switch events, specific bus or system operations, and the like. Optionally using already existing unused redundant elements which otherwise go unused, enables current array sizes to be left unaltered. The small monitor built-in self-test (MBIST) engine 110 is provided.

In accordance with features of the preferred embodiment, degradation detection apparatus 102 uses one or more of the monitor bit lines 116, monitor word lines 118 and the separate monitor array 124, for detecting leakage and degradation of signal and timing control. By monitoring with degradation detection apparatus 102 in the memory chip 100, degradation detection apparatus 102 can determine when the array signal or timing and voltage margins are degrading for any reason, for example, either due to somewhat pervasive marginal defects, excessive leakage caused by high junction temperatures transistor degradation in the cells, voltage margin degradation, unanticipated internal noise, inadequate timing margin, and the like.

In accordance with features of the preferred embodiment, degradation detection apparatus 102 provides many advantages. It is possible to set the refresh rate based on the actual operating conditions of the memory 100, improving system performance and allowing it to actually refresh less often. In such situations, this also allows the system to consume less power as only the amount of refresh needed is used. Degradation detection apparatus 102 also enables memory chips to warn the system that they are becoming marginal; that is, close to losing data so that corrective action can be taken to prevent data loss. Degradation detection apparatus 102 enables memory chips to run at high temperature and yet guarantee data integrity where systems today could lose data and cause a machine crash. Degradation detection apparatus 102 can be applied to other types of data arrays and registers to insure correct operation with some degree of margin, or to note an approaching failing situation to take appropriate preventative action.

It should be understood that for situations where a large number of devices, each using degradation detection apparatus 102, and are being accessed in parallel, each of the large number of devices advantageously are independently adjusted for internal refresh to maximize power savings.

In the degradation detection apparatus 102, while the separate array 124 includes bit lines, word lines, sense amplifiers, and associated address and data generation and compare circuitry, the separate array 124 is sufficiently small in size so as not to impact the overall chip area or power. The separate monitor array 124 preferably is placed in proximity to the MBIST engine 110 and could communicate with either a wide or narrow interface. Generally, the separate monitor array 124 is placed in an otherwise unused location and would therefore not impact device or array size.

In accordance with features of the preferred embodiment, degradation detection apparatus 102 monitors leakage by varying the refresh rate of the monitor cell or monitor cells. During memory initialization a data retention test can be performed on the degradation detection apparatus 102 to determine where the refresh rate of the monitor cells should be set to guarantee data retention or the system can test various stress levels on the monitor bits to determine how much relaxation could be applied. Under normal operating conditions the system can choose to use the standard refresh rate or access this data with a slower refresh rate. If the system potentially operates above the maximum junction temperature, this data can be used by the system to increase the refresh rate to preserve data. Another use of the degradation detection apparatus 102 during run time is to notify the system when one or more of the monitor cells loses data. The system can then respond by ignoring in the notice, waiting until more than one bit is affected or a threshold exceeded, rewriting the failed bit or bits to see if the error goes away, looking for ECC errors in addition to the monitor fails and warning the system if one or both are occurring, increasing the system refresh rate to memory, de-allocating this memory device, or taking the system down.

In the case of non-DRAM arrays, the monitor locations of the degradation detection apparatus 102 are preloaded or set at power-up time and read during normal access operations. In the case of the monitor word lines 118, the lack of an equivalent refresh command would mean that reading or writing such locations would block access to real array locations. If a variable access time can be tolerated, or if a look ahead structure exists that allows access to the monitor bits to be performed between normal operations without delaying the normal operations, then the monitor word lines 118 of the degradation detection apparatus 102 can still be used with minimal impacts. When variable access or look ahead structure options are not viable, then one of the other embodiments of monitor bit lines 116 or separate monitor array 124 is used instead of the monitor word lines 118.

Monitor bits are initialized to a known value controlled by on chip circuitry 112 of the MBIST engine 110 that is comparable in function to array built-in self-test (ABIST) engines. The MBIST control circuitry 112 is responsible to control access, restore, address control, data generation, data compare, refresh, and all associated function with these specific bits. Typically such bits are made accessible through any of the normal data-paths although in test modes some form of access could be architected if desired. Aspects of MBIST control circuitry 112 are controlled by mode register setting (MRS)/EMRS commands to industry standard DRAM memory devices so that the timing, data pattern, frequency of access, frequency of refresh, enable/disable of the entire function, heating or not heating, and reporting of errors can be controlled. Also some of these items can be dynamically altered based upon register settings. ASIC chips, such as illustrated in FIG. 2, simply use registers and set the monitor bits to the appropriate values through normal register flush or write commands to control monitor operations and settings.

For monitor bits implemented as spare bit lines or as a single spare bit line 116, the extra bit line and sense amplifier circuits are accessed at the same time real bit lines are accessed in the particular array 0, 104 where the monitor bits exist. It should be understood that monitor bits can exist in one or more of the arrays 104, 0–3, and also can exist in all arrays if desired. The monitor bits can be written with refresh commands and they are not compared until all locations have been initialized. In the case of the monitor bits initialized to a known value, if using refresh to write the monitor bits typically requires an entire refresh period, such as, 64 ms. Alternatively, the system can perform a refresh of all locations to initialize all monitor locations with data generation handled by the MBIST engine 110. In the case of non-DRAM arrays, the data can be written by accessing each row location, again using the MBIST engine 110 to generate the data. After initialization, the data may remain read-only if desired and is simply compared with the deterministic value set by the MBIST control circuitry 112. Mis-compares are noted and reported to the system as defined by predefined monitor reporting settings, such as report all errors, report all errors after a threshold, ignore errors, and the like. Data that is detected bad can be rewritten good and then the compare continues or alternately the data is left bad and only reported if a different additional location goes bad. Data is refreshed at exactly the same rate as all real data. Since monitor bit line or lines 116 are just an extension of the number of bits in a sub array by one or more bit lines, a word line access for read, write, refresh will by definition also access the monitor bit just as often as real bits along each word line. Since monitor bits may be accessed more often than once every refresh due to normal read and write activity in the real array, it may not always represent the maximum stress for retention duration. However, it will be consistent in retention stress for each array bit on a word line by word line basis. With the implementation, one monitor bit is accessed or multiple monitor bits are accessed with each refresh command, and with each row access for a normal read or write with at least one monitor bit on every word line.

In the case of the monitor bit lines 116, there are only as many bits to analyze as there are monitor bit lines used, and this results in a one or a few bits being analyzed with each refresh command, and/or with each row activate. In this case the data is naturally serialized.

For monitor bits implemented as spare word lines 118 or as a single spare word line, the monitor bits are represented only in extra word lines 118 or an extra word line that extends the real data array 104 by the number of extra rows represented with the monitor bits. With the monitor word line 118 all bits are written at once with a known pattern, for example, by causing an accessed word line to remain selected, or the word line active and sense amplifiers set, while a second word line is accessed. The second word line irrespective of contents is overwritten with the contents of the first word line. The system could write one word line with the correct expected pattern for the MBIST engine 110 and then copy the pattern to the monitor word line with a special command.

Substantially no data array area impacts are associated with the spare word lines 118 of degradation detection apparatus 102. The method of reading the data can best be described as consistent with what has historically been done with video RAMs. A serial shift register latch structure is multiplexed onto the selected bit lines when the monitor word line 118 is accessed, after the sense and amplification is complete. This in turn copies the entire word line 118, or a fraction of the word line, such as ½, ¼, into an area that in turn can now communicate with the MBIST engine 110 on a delayed basis with as little as one wire and shift clock to serially send the data. This operation is not timing critical. Writing the data also can be performed using this additional shift register. If only a fraction of the monitor word line 118 is accessed at a time, then multiple passes or operations are needed to either read or write all locations and some control, manual or automatic, is used to determine which section is accessed. The addition of such a serial shift register does impact the array area somewhat. In the case of a DRAM, the monitor word line 118 accesses all monitor bits at once by stealing one refresh command infrequently. As such, substantial time exists between monitor accesses, typically 64 ms or more, to analyze and react to the data.

The monitor bits implemented as spare word lines 118 may be refreshed at the same rate as the real data array, or at any interval that is a multiple of the real refresh interval to the device as programmed within the monitor control circuitry. Bits may be refreshed at virtually any rate by simply choosing to steal a real refresh once every N refresh commands where the value N chosen by the system user. It may not make sense to refresh more often than the real bits. For example, if the part is an 8K refresh every 64 ms, then refreshing the monitor bits once every 8096 refresh commands would be 1× the rate of the real bits. However, a rate of 1.1×, 1.25×, 1.3×, 2.1×, 5×, and the like could also be chosen. As with the monitor bit lines 116, the monitor bits are written only at refresh time, but since all monitor bits are accessed in one word line with one access the monitor bits can all be written in one access. Compares are also done in one access. Many techniques exist to both overwrite all bit lines and to compare all bit lines with minimal amount of overhead. Monitor bits are only accessed with a refresh command, and are therefore a good representation of worst case retention stress. Non-DRAM arrays without refresh can be handled as described for monitor bit lines 116 and if those alternatives already discussed are not viable, then this embodiment is not usable. All data error reporting options exist as described for monitor bit lines 116. All data is compared when the monitor word line is accessed after it has been initialized. Data may remain read only after initialization or may be updated based on desired monitor control circuitry 112. For example, any type of pattern desired can be used and updated in succeeding operations at integer values.

For monitor bits implemented as an entire separate array 124, the greatest amount of flexibility is provided in terms of how often the monitor cells are refreshed since the separate array 124 does not need to be coupled to any external operations. The separate array 124 can be implemented in areas on the chip that often do not contain active circuitry. As with the above options, this operation would normally not occur more often than a normal refresh, and can also be coupled to occur with normal refresh commands if desired. The power associated with the separate array 124 is minimal, since the separate array 124 represents a small fraction of the overall bits of the entire chip which are addressed typically only once every refresh period. With the separate array 124, any concerns with adjacent cell disturb patterns can be addressed by having the MBIST control circuitry 112 provide exact patterns that provide the worst case stress on a fixed or dynamically changing basis, with not all cells are stressed at once but the patterns can be moved around so that all cells eventually see a worst case pattern. If desired to save even more power, the operation can be altered to only use a subset of the total bits, or as noted above to be turned off altogether. Redundant monitor elements are easiest to implement efficiently with the separate array 124.

Statistically speaking, a sufficiently representative number of monitor bits is desirable so that at least one monitor bit would be detected as going bad before any real data is affected. Refreshing these monitor bits less often than real bits can maximize the probability of causing this to happen. This also could be accomplished with a refresh rate that is consistent with the real cells but by intentionally storing the monitor cells with less charge to degrade the signal margin of the monitor cells so the monitor cells fail before any real cell would fail. Timing margins can also be shaved so that reads and/or writes are more aggressive on monitor bits. Intentional bit line mismatch, such as, true vs. complement, and complement vs. true, due to voltage or loading offsets can be implemented with the monitor bit lines 116, monitor word lines 118, and the separate array 124.

It should be understood that a host of other signal margin techniques could be complemented with the monitor bit lines 116, monitor word lines 118, and the separate array 124 of the degradation detection apparatus 102, for example, using localized heating around monitor cells as compared to real cells to insure monitor cells see the worst case conditions on the chip. The monitor bit lines 116, monitor word lines 118, and the separate array 124 of the degradation detection apparatus 102 may also be used in any combination and may be programmed with the MBIST control registers 114.

The use of redundancy can be flexible enough so that the degradation detection apparatus 102 uses redundancy that was not used to repair the memory arrays so that no array area impacts are incurred. The MBIST engine 110 requires appropriate control, for example, with the redundancy fuses so that only unused elements are used as monitor elements 116, 118, 124. All redundant elements are tested at manufacturing time to insure all data elements work or are disabled, with fuse blow as one example, so that redundant elements are not used as monitor elements when defective.

In a system with many devices which are accessed in parallel using the concepts as described above, it may also be advantageous or desirable to independently adjust chips to lower refresh settings to optimize power savings. Since implementations typically use a common command interface to communicate to all devices at once, the data or strobe path to the devices must be used in conjunction with commands to tell a device to either respond to the refresh less often command or go to a different setting) or to ignore the command. In this way, the system doesn't have to stop lowering the refresh rate when the 1st device in a group of devices complains. It can simply tell that device to stop adjusting and move on to keep adjusting all devices until a maximum power savings is realized. Even if many or most devices are ignoring refresh commands, the group of devices remain unavailable for normal read and write operations as at least one device is responding to the command and the system may well not know which commands are skipped and which ones are executed. So just as the monitor bits can have their refresh rates adjusted (or independently adjusted using this concept), the real refresh rate of the DRAM can be adjusted even if the external refresh rate remains fixed at one refresh rate. They could be told to skip every 100th, every 10th, every 3rd, every other, or only respond to every 4th refresh command, etc. This would be based on the knowledge gained by the on device monitor structure.

It should be understood that another factor to consider in terms of providing margin is to have the monitor cell structures altered so that devices are intentionally narrower and wider, and shorter and longer to stimulate the on chip variations due to print issues, such as, ACLV, pattern density, edge effects, and the like. In the case of SRAM cells, using such shifts to produce intentional offsets, for example, cells that favor one state as compared to the other state but should still work. There simply needs to be enough monitor cells to create all the desired permutations and the alterations along with the normal variations needed to not result in consistent failure (continue to work within the guardband margin by design). This can be used to guarantee that the expected variations still function as intended and exist within the product chip instead of the kerf, and so remain available to study if failing devices return with electrically usable test structures to compare against.

Referring now to FIG. 2, there is shown an exemplary application specific integrated circuit (ASIC) 200 with exemplary degradation detection apparatus generally designated by the reference character 202 for implementing degradation detection in accordance with the preferred embodiment. Degradation detection apparatus 202 advantageously is applied to the logic portion of ASICs or processor chips 200 to sense chip performance degradation over time due to hot-e, NBTI, or EM. ASIC 200 includes an embedded memory array 203, and a plurality of critical paths 0–N, 204, each including a system latch 206.

Degradation detection apparatus 202 includes a monitor built-in self-test (MBIST) engine 210 including MBIST control circuitry 212 and MBIST registers 214. As shown in FIG. 2, a respective redundant, monitor latch 216 coupled to the MBIST engine 210 is placed in the critical paths 204 in parallel with the system latches 206. The timings of these redundant/monitor latches 216 can be made a little tighter than the real latches 206 with the same logic to give an indicator of good timing verses bad timing. The data on these latches 216 are compared to the real data, for example, with an XOR. If there are frequent, or any, mismatches between the data, a flag can be used to tell the system to increase chip voltage or reduce chip frequency to prevent the system from crashing. Paths 204 can be chosen which are logic dominated, split between logic and wire, wire dominated, or any combination of the three. Multiple such key paths 204 on the chip 200 in various quadrants, or other chip fractional parts, could be useful in helping to determine which types of paths fail at various process, temperature, and voltage corners. Real logical paths are used only when the path is being stressed, and can be used to provide an early indicator of chip performance health. Timing differences between the real and monitor paths could be adjusted to the desired amount with fuse trimming. Additionally, the monitor path could be gated off for power or test purposes, or only turned on infrequently, one out of every 10,000 cycles, or a threshold applied as described for memory monitor bits of degradation detection apparatus 102.

It should be understood that in addition to having a monitor latch 216 that provides a slightly tighter timing path to be tested as an early warning, the monitor latch 216 can be implemented with a slightly later or larger amount of timing margin. This would be used to determine if the real path 204 did not make it, and was actually too late to be captured correctly. Such monitor latch 216 also is XOR'ed with the real latch, and in this case a mis-compare would indicate a machine check condition or that the wrong value was captured, assuming it is not an ECC data path that can be corrected, the contents of the latch/register cannot be trusted. This type of structure could be implemented in addition to the early warning or instead of the early warning. Another possible implementation is to mix and match the type of monitor check on different paths to minimize the amount of additional loading that the monitor latches 216 create, for example, use one or the other type of monitor latch 216 on a particular path 204, but not both.

It is also very easy to validate the appropriate settings by stressing components or systems with various combinations of temperature, voltage, timing, and refresh conditions to insure that monitor bits fail first and that a margin exists before real cells or logic fail.

While the present invention has been described with reference to the details of the embodiments of the invention shown in the drawing, these details are not intended to limit the scope of the invention as claimed in the appended claims.

What is claimed is:

1. A method for detecting degradation in an integrated circuit comprising the steps of:
   providing a monitor built-in self-test (MBIST) engine;
   providing MBIST control circuitry and MBIST registers with said MBIST engine;
   providing at least one monitor element coupled to said MBIST engine; said at least one monitor element being defined by predefined circuit elements in the integrated circuit;
   providing latch circuitry coupled to said MBIST engine, said latch circuitry used to communicate monitor bits with said MBIST engine;
   utilizing said MBIST engine for controlling operation of said at least one monitor element, communicating monitor bits, and deterministically stressing predefined circuit element functions of said at least one monitor element;
   identifying degradation of each of array signal, array timing, and voltage margins utilizing said at least one monitor element; and
   using said at least one monitor element with said MBIST engine to identify a degraded situation for enabling appropriate preventative action.

2. A method for detecting degradation in an integrated circuit as recited in claim 1 wherein the step of providing at least one monitor element coupled to said MBIST engine includes the steps of providing at least one monitor element defined by unused circuit elements or instantiations of said unused circuit elements in the integrated circuit.

3. A method for detecting degradation in an integrated circuit as recited in claim 1 wherein the step of providing at least one monitor element coupled to said MBIST engine includes the steps of providing at least one monitor element used as a monitor bit line.

4. A method for detecting degradation in an integrated circuit as recited in claim 1 wherein the step of utilizing said MBIST engine for controlling operation of said at least one monitor element, communicating monitor bits, and deterministically stressing said predefined circuit element functions of said at least one monitor element includes the steps of selectively controlling timing, data pattern, frequency of access, frequency of refresh, enabling, and heating of said predefined circuit elements of said at least one monitor element.

5. A method for detecting degradation in an integrated circuit as recited in claim 1 wherein the step of providing at least one monitor element coupled to said MBIST engine includes the steps of providing at least one monitor element defined by a separate monitor array; said separate monitor array including unique word lines, bit lines, and control and sense circuitry.

6. A method for detecting degradation in an integrated circuit as recited in claim 1 wherein said separate monitor array is placed proximate to said MBIST engine.

7. A method for detecting degradation in an integrated circuit as recited in claim 1 the step of providing at least one monitor element coupled to said MBIST engine includes the steps of providing at least one monitor element applied to at least one of data arrays and registers; said at least one monitor element used with said MBIST engine to insure correct operation of said at least one of data arrays and registers with a defined degree of margin.

8. A method for detecting degradation in an integrated circuit as recited in claim 1 wherein the step of utilizing said MBIST engine for controlling operation of said at least one monitor element and communicating monitor bits includes the steps of generating a predefined data pattern utilizing said MBIST engine.

9. A method for detecting degradation in an integrated circuit as recited in claim 1 wherein said at least one monitor element is defined by at least one monitor bit line of a memory array; and the step of utilizing said MBIST engine for controlling operation of said at least one monitor element and communicating monitor bits includes the steps of writing monitor bits with refresh commands.

10. A method for detecting degradation in an integrated circuit as recited in claim 1 wherein said at least one monitor element is defined by at least one monitor bit line of a memory array; and the step of utilizing said MBIST engine for controlling operation of said at least one monitor element and communicating monitor bits includes the steps of writing monitor bits by accessing each row location with said MBIST engine generating a predefined data pattern.

11. A method for detecting degradation in an integrated circuit as recited in claim 1 wherein said at least one monitor element is defined by at least one monitor word line of a memory array; and the step of utilizing said MBIST engine for controlling operation of said at least one monitor element and communicating monitor bits includes the steps of writing monitor bits with refresh commands with said MBIST engine generating a predefined data pattern.

12. A method for detecting degradation in an integrated circuit as recited in claim 1 wherein the step of utilizing said MBIST engine for controlling operation of said at least one monitor element and communicating monitor bits includes the steps of providing MBIST control circuitry for initializing monitor bits to a known value; utilizing said MBIST control circuitry to control one or more functions including access, restore, address control, data generation, data compare, and refresh functions associated with the monitor bits.

13. A method for detecting degradation in an integrated circuit as recited in claim 1 wherein said at least one monitor element is defined by a separate array and the step of utilizing said MBIST engine for controlling operation of said at least one monitor element and communicating monitor bits includes the steps of generating one of a fixed predefined data pattern or a dynamically changing data pattern utilizing said MBIST engine.

14. Apparatus for detecting degradation in an integrated circuit and the integrated circuit includes a memory array, said apparatus comprising:
   a monitor built-in self-test (MBIST) engine;
   said MBIST engine including MBIST control circuitry and MBIST registers;
   at least one monitor element coupled to said MBIST engine; said at least one monitor element defined by predefined circuit elements in the integrated circuit and including at least one of a monitor bit line of the memory array, and a monitor word line of the memory array;
   said MBIST engine controlling operation of said at least one monitor element, communicating monitor bits, and deterministically stressing said predefined circuit element functions of said at least one monitor element; and identifying degradation of each of array signal, array timing, and voltage margins utilizing said at least one monitor element;
   said at least one monitor element applied to at least one of data arrays and registers; said at least one monitor element used with said MBIST engine to insure correct operation of said at least one of data arrays and registers with a defined degree of margin;

said at least one monitor element being used with said MBIST engine to identify a degraded situation for enabling appropriate preventative action; and latch circuitry coupled to said MBIST engine latching monitor bits, said latch circuitry used to communicate with said MBIST engine.

15. Apparatus for detecting degradation in an integrated circuit as recited in claim 14 wherein said MBIST engine includes MBIST control circuitry and MBIST registers coupled by said latch circuitry to said at least one monitor element.

16. Apparatus for detecting degradation in an integrated circuit as recited in claim 14 wherein at least one monitor element includes unused circuit elements or instantiations of said unused circuit elements in the integrated circuit.

* * * * *